(12) United States Patent
Kawabata et al.

(10) Patent No.: US 7,176,080 B2
(45) Date of Patent: Feb. 13, 2007

(54) METHOD OF FABRICATING SEMICONDUCTOR DEVICE

(75) Inventors: Itaru Kawabata, Mie (JP); Hirofumi Inoue, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/092,900

(22) Filed: Mar. 30, 2005

(65) Prior Publication Data
US 2005/0218441 A1 Oct. 6, 2005

(30) Foreign Application Priority Data
Mar. 31, 2004 (JP) ............................. 2004-107153

(51) Int. Cl.
*H01L 21/8234* (2006.01)
*H01L 21/8244* (2006.01)
(52) U.S. Cl. ........................................ 438/238; 257/68
(58) Field of Classification Search ................ 438/238, 438/239, 386, 399; 257/68, 71, 296, 301, 257/302
See application file for complete search history.

(56) References Cited
U.S. PATENT DOCUMENTS
6,744,089 B2 * 6/2004 Wu ............................. 257/301

OTHER PUBLICATIONS

English Abstract of Japanese Patent Application Publication No. 2001-267528, published Sep. 28, 2001. (This application, Application No. 2000-078892, filed Mar. 21, 2000, is referenced in the specification of the present application.).

* cited by examiner

*Primary Examiner*—Phuc T. Dang
(74) *Attorney, Agent, or Firm*—Oblon, Spivak, McClelland, Maier & Neustadt, P.C.

(57) ABSTRACT

A method of fabricating a semiconductor device includes forming trenches in active areas respectively, the trenches having sidewalls and upper openings respectively, forming first conductive regions in the trenches so that the first conductive regions serve as electrodes of the trench capacitors, respectively, each first conductive region including first impurity of a predetermined conductive type, forming sidewall insulating films on the sidewalls located over the first conductive regions respectively, forming second conductive regions inside the sidewall insulating films respectively, removing the sidewall insulating film located above the second conductive regions respectively, doping regions of the substrate located under the gate electrodes with second impurity of a reverse conduction type relative to the first impurity in the second direction from the upper openings through portions of the trenches from which the sidewall insulating films have been removed respectively, and forming third conductive regions in the portions of the trenches.

6 Claims, 7 Drawing Sheets

METHOD OF FABRICATING SEMICONDUCTOR DEVICE

CROSS-REFERENCE TO RELATED APPLICATION

This application claims priority from Japanese patent application No. 2004-107153, filed Mar. 31, 2004, the content of which is incorporated herein by reference.

BACKGROUND OF THE INVENTION

1. Field of the Invention

The present invention relates to a method of fabricating semiconductor device provided with a plurality of unit cells each of which includes an impurity doped region.

2. Description of the related art

JP-A-2001-267528 discloses a method of manufacturing a semiconductor memory provided with trench capacitor DRAM cells, for example. In the disclosed method, a trench is filled with a polycrystalline silicon film doped with As (impurity). Thereafter, As is diffused from the polycrystalline silicon film filling the trench into the semiconductor substrate by heat treatment in the forming of a silicon oxide film to fill shallow trench isolation (STI), whereby a buried contact (strap) is formed. This can suppress an increase in resistance in a boundary between the polycrystalline silicon film and the substrate and accordingly an electrical resistance value between the polycrystalline silicon film and the substrate. Consequently, a capacitor charge/discharge speed can be prevented from being reduced, and the resultant data write/read failure can be prevented.

However, a cutoff characteristic of the cell transistor is deteriorated when the impurity is diffused thereby to reach a substrate region under a cell transistor. Accordingly, a strict adjustment is required for diffusion in the periphery of boundary from both sides of the boundary resistance and cutoff characteristic.

High integration and refinement have recently been more remarkable as compared with the prior art and accordingly, it has been desired to further densify the unit cell. As a result, the following drawback would be caused. When the unit cells are arranged in a high-density order, even an active area of a unit cell proximal to each unit cell would adversely be affected in a fabrication process of each unit cell.

In the aforesaid DRAM semiconductor storage, a distance between an active area and trench of memory cells adjacent to each other is reduced with high integration and refinement. Accordingly, when a DRAM semiconductor storage is manufactured by the aforementioned method disclosed by the foregoing Japanese patent application publication gazette, impurity diffused into an outer periphery of the trench for suppression of electrical resistance reaches an active area of an adjacent memory cell, whereupon the adjacent memory cell is adversely affected.

In particular, a region into which impurity is diffused in order to suppress electrical resistance is sometimes an active area located under a gate electrode of the adjacent cell transistor. Furthermore, part of the impurity located under the gate electrode is passivated when impurity to be diffused is of reverse conduction type relative to a channel region of the active area. As a result, the cutoff characteristic of the adjacent cell transistor is deteriorated and/or resistance to punch-through is deteriorated.

BRIEF SUMMARY OF THE INVENTION

Therefore, an object of the present invention is to provide a method of fabricating a semiconductor device in which when the unit cells are arranged in a high-density order, an active area of a unit cell proximal to another unit cell can be prevented from being adversely affected in a fabrication process of said another unit cell.

The present invention provides a method of fabricating a semiconductor device including a plurality of active areas formed on a surface of a semiconductor substrate, each active area extending in a first direction and being adjacent to each other in a second direction perpendicular to the first direction, respectively, a plurality of trench capacitors disposed in ends of the active areas respectively, a plurality of gate electrodes disposed on the active areas and being adjacent to the trench capacitors of adjacent active areas in the second direction, respectively, the method comprising forming a plurality of trenches in the active areas respectively, the trenches having sidewalls and upper openings respectively, forming a plurality of first conductive regions in the trenches so that the first conductive regions serve as electrodes of the trench capacitors respectively, each first conductive region including first impurity of a predetermined conductive type, forming sidewall insulating films on the sidewalls located over the first conductive regions respectively, forming a plurality of second conductive regions inside the sidewall insulating films respectively, removing the sidewall insulating film located above the second conductive regions respectively, doping regions of the substrate under the gate electrodes with second impurity of a reverse conduction type relative to the first impurity in the second direction from the upper openings through portions of the trenches from which the sidewall insulating films have been removed respectively, and forming a plurality of third conductive regions in said portions of the trenches.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
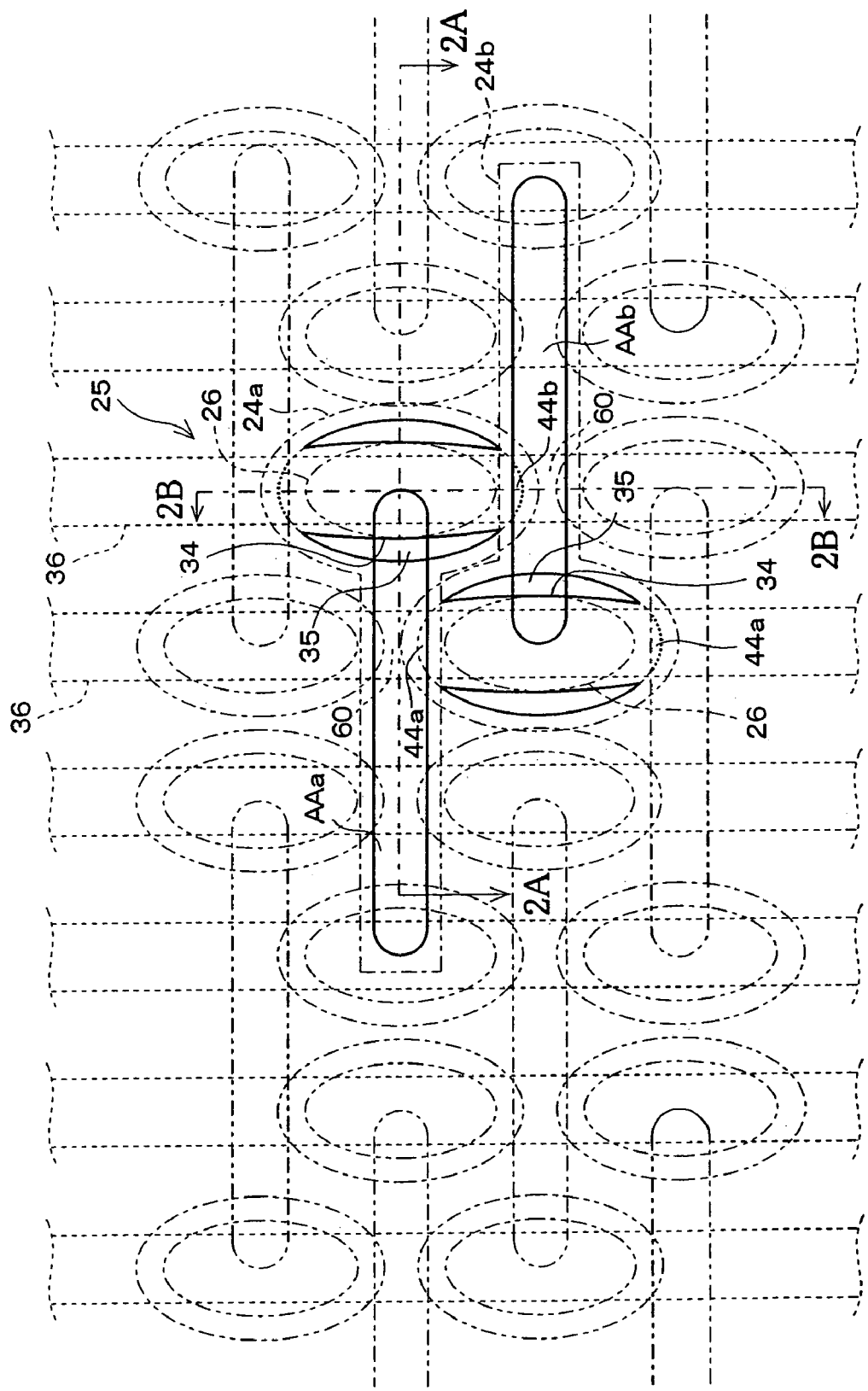
FIG. 1 is a typical plan view of a semiconductor device of one embodiment in accordance with the present invention.

One embodiment of the present invention will be described with reference to the accompanying drawings. Referring to FIG. 1, a memory cell region of a trench capacitor type DRAM semiconductor memory 21 is shown. A p-type silicon substrate 22 is employed as a semiconductor substrate in the following embodiment. However, a semiconductor substrate provided with a p-type well region may be employed as the substrate instead of the p-type silicon substrate. Additionally, a reverse conduction type substrate may be employed.

The DRAM semiconductor memory 21 provided with the trench capacitor type DRAM cells comprises a silicon semiconductor substrate 22 on which a plurality of unit memory cells 24a and 24b are arranged so as to form a memory cell region 25. Each unit memory cell 24a includes a capacitor C and a cell transistor 23. Each unit memory cell 24b adjacent to the unit memory cell 24a also includes a capacitor C and a cell transistor 23. Thus, since the components of each unit memory cell 24a have the same functions as those of each unit memory cell 24b, the components of the unit memory cells 24a and 24b are labeled by the same reference symbols.

The structure of each unit memory cell 24a will now be described. Each unit memory cell 24a is formed with a deep trench 26. A capacitor C is formed in each trench 26. A plate diffusion region 27 is formed around each trench 26 so as to extend from a lower part of each trench 26 to a predetermined height. Each plate diffusion region 27 serves as one of plate electrodes of the capacitor C. A nitride oxide (NO) film 28 is formed on the plate diffusion region 27 on the inner surface of the trench 26. Each NO film 28 serves as a capacitor insulating film for separating both plate electrodes of the capacitor C. A first conductive layer 29 is formed on the NO film 28 in each trench 26. The first conductive layer 29 is made from a polycrystalline silicon or amorphous silicon doped with impurity or polycide. The first conductive layer 29 serves as the other plate electrode of each capacitor C.

A sidewall insulating film 30 is formed on inner peripheral surfaces of the sidewalls so as to be located on the first conductive layer 29 and NO film 28. The sidewall insulating film 30 serves to suppress leak current produced by a vertical parasitic transistor. A second conductive layer 31 is formed inside the sidewall insulating film 30 to serve as a storage node electrode. The second conductive layer 31 is also made from a polycrystalline silicon or amorphous silicon doped with impurity or polycide.

An element isolating film 32 made of an oxide film is provided on a part of the second conductive layer 31. The element isolating film 32 has a function of isolating itself from the other unit memory cells. The element isolating film 32 is not shown in FIG. 1. Further, a third conductive layer 33 is formed on the second conductive layer 31 and serves as a buried strap. The third conductive layer 33 is made from amorphous silicon or a polycrystalline silicon doped with donor-type impurity such as As or polycide.

Each cell transistor 23 is formed at a predetermined side of the trench 26 so as to be adjacent to and connected to the capacitor C of the trench 26. A strap 35 is anisotropically formed in an outer peripheral portion of the trench 26 including a boundary between the third conductive layer 33 and the cell transistor 23. The strap 35 serves as an impurity semiconductor region. The strap 35 is made by diffusing a donor-type impurity outward via a boundary 34 from the third conductive layer 33 so as to be located at the upper outer periphery of the trench 26. Consequently, electrical resistance can be reduced in a junction region between the third conductive layer 33 and the cell transistor 23 or between a diffusion region 38 of the cell transistor 23 and the capacitor C.

Each cell transistor 23 comprises a gate electrode 36, a gate insulating film 37 and the n-type diffusion regions 38 and 39 (source/drain diffusion layers). A bit line 41 is electrically connected via a contact plug 40 to the diffusion region 39. An interlayer dielectric film 42 is formed so as to electrically isolate the bit line 41 from the memory cells 24a and 24b. A gate sidewall insulating film 43 is formed so as to cover the gate electrode 36.

Each memory cell 24a is configured as described above. A plurality of such memory cells 24a and 24b are arranged horizontally as shown in FIG. 1. Each trench 26 has a circular transverse section. An active area AAb of each memory cell 24b is formed so as to be adjacent to the trench 26 of the memory cell 24a as shown in FIG. 1. The active area AAb is referred to as a functional region of the cell transistor 23 of the adjacent memory cell 24b, which functional region includes a channel region. The cell transistor 23 of the memory cell 24b has the same configuration as that of the memory cell 24a. The active area AAb is also indicative of a p-type electrode region of the substrate 22 under the diffusion regions 38 and 39, gate electrode 36 and gate dielectric film 37 of the memory cell 24b. FIG. 1 also schematically illustrates an active area AAa.

When the memory cells 24a and 24b are in proximity to each other as shown in FIG. 1, the trench 26 of the memory cell 24a is excessive proximity to the active area AAb of the adjacent memory cell 24b. Consequently, desired characteristics and functions cannot be achieved particularly in the p-type electrode region under the gate electrode of the active area AAb of the adjacent memory cell 25b by the influence of the strap 35 formed as the result of diffusion of donor type impurity around the upper periphery of the trench 26.

Figure 2A:
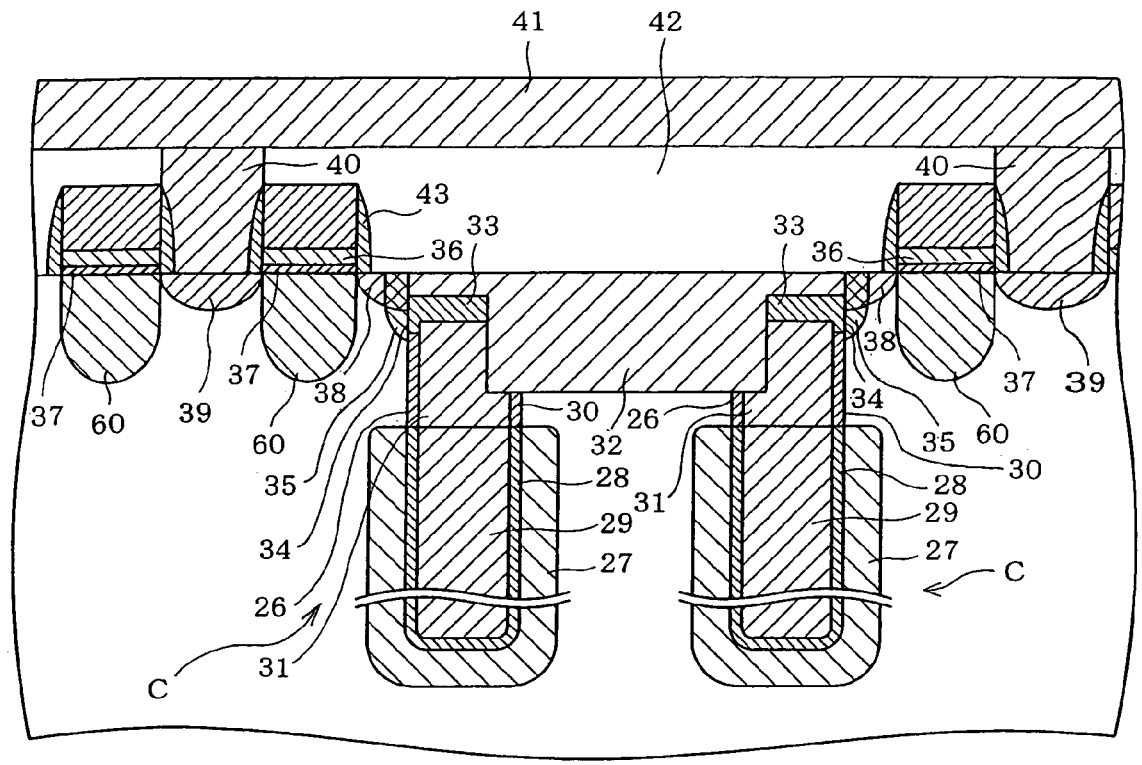
FIGS. 2A and 2B are sectional views taken along lines 2A—2A and 2B—2B in FIG. 1 respectively.
Figure 2B:
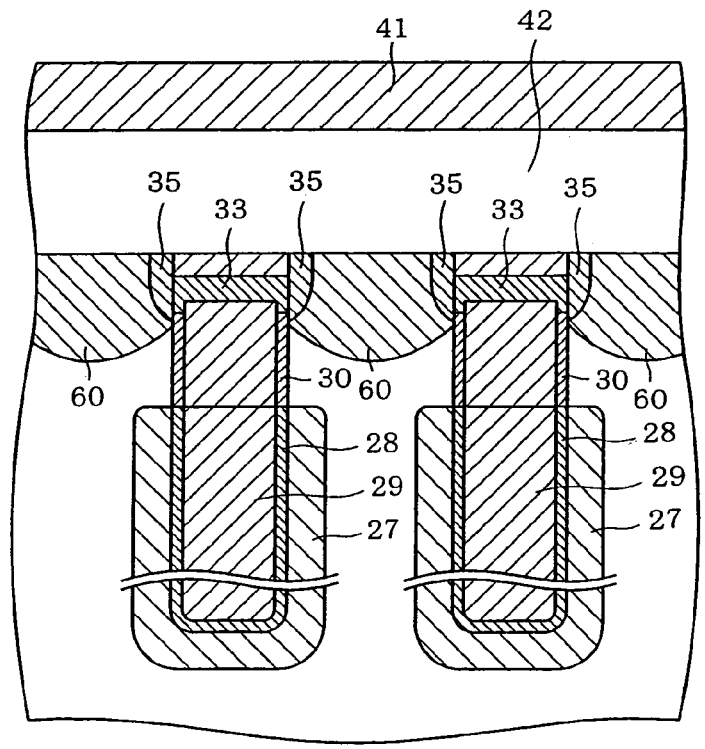

In view of the aforementioned problem, as shown in FIGS. 1 to 2B, acceptor type impurity is supplied to the p-type electrode region (channel region) under the gate electrode 36 and gate dielectric film 37 so as to compensate for the function of the active area AAb. More specifically, the donor type impurity is diffused in the region 44b where the strap 35 has diffused under the gate electrode 36 and gate dielectric film 37 of the active area AAb, as shown in FIG. 1. However, since the acceptor type impurity supplied to the region 44b is formed into a reverse conduction type impurity region 60, the function of the active area AAb is retained by the existence of the acceptor type impurity.

The acceptor type impurity is also supplied to the p-type electrode region under the gate electrode 36 and gate dielectric film 37 of the memory cell 24a so as to compensate for the function of the active area AAa. Accordingly, the function of the active area AAb is also retained by the existence of the acceptor type impurity although the donor type impurity is diffused in the region 44a.

According to the foregoing embodiment, the donor type impurity is doped in order to suppress the electrical resistance between the cell transistor 23 of the memory cell 24a and the third conductive layer 33 (capacitor C). As a result, the strap 35 is formed around the upper periphery of the trench 26. Even when the memory cells are arranged so that the strap 35 has an adverse effect on the function of the adjacent memory cell 24b, the acceptor type impurity is supplied to the p-type electrode region under the gate electrode 36 and gate dielectric film 37 of the diffused region 44b so as to compensate for the function of the active area AAb. Consequently, the function of the adjacent memory cell 24b can be retained.

A method of fabricating the foregoing memory 21 will be described with reference to FIGS. 3 to 12 which are sectional vies taken along line 2B—2B in FIG. 1 and show a sequence of steps of the fabricating method.

Figure 3:
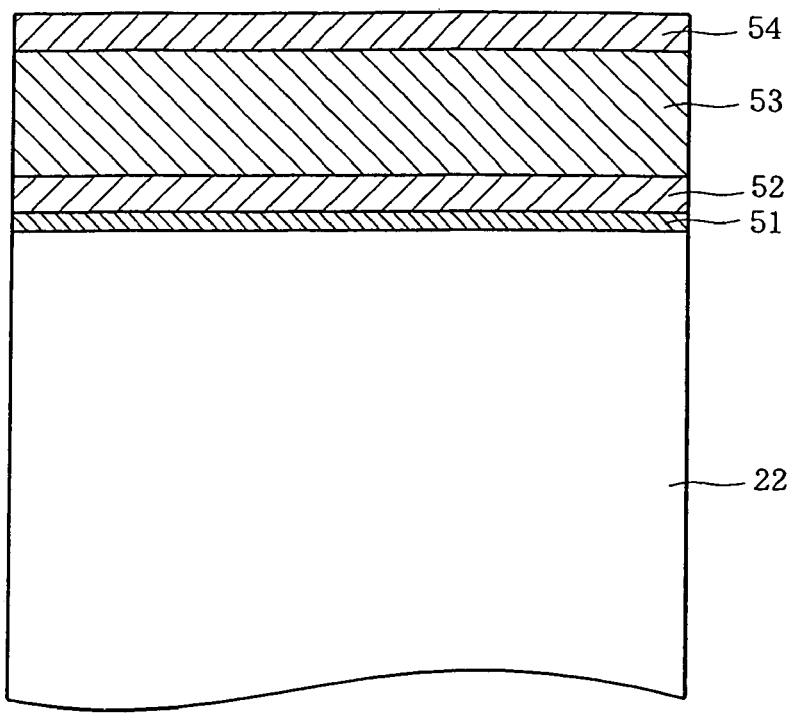
FIGS. 3 to 12 are typical longitudinal side sections of the semiconductor device, showing sequential fabrication steps (steps 1 to 10).

A silicon oxide film 51 is deposited on the silicon substrate 22, and a silicon nitride film 52 is deposited on the silicon oxide film 51, as shown in FIG. 3. A boron silicate glass (BSG) film 53 is further deposited on the silicon nitride film 52, and a tetraethyl orthosilicate (TEOS) film 54 is deposited on the BSG film 53.

Figure 4:
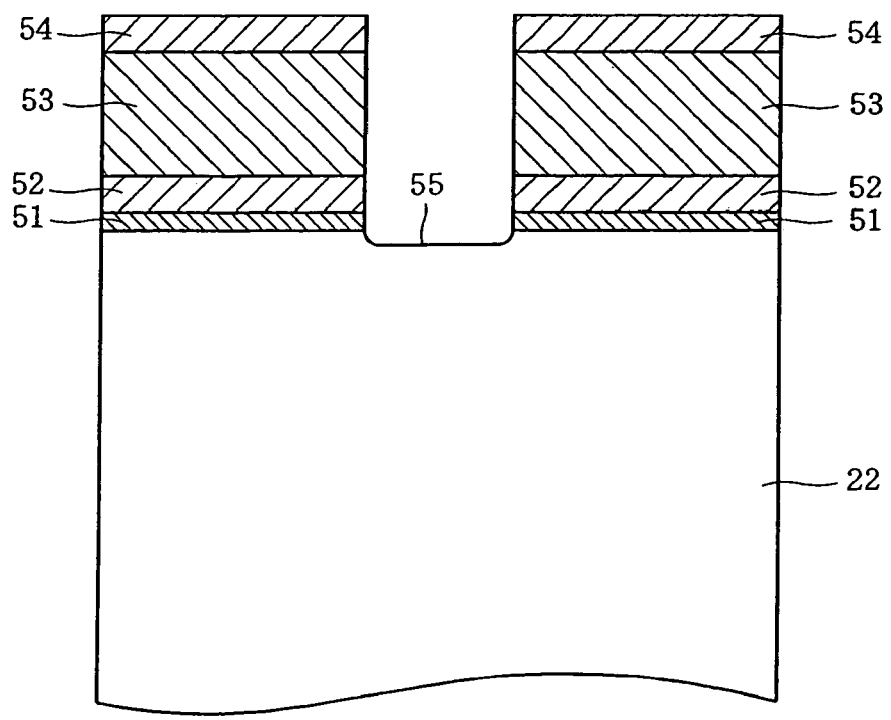
Figure 5:
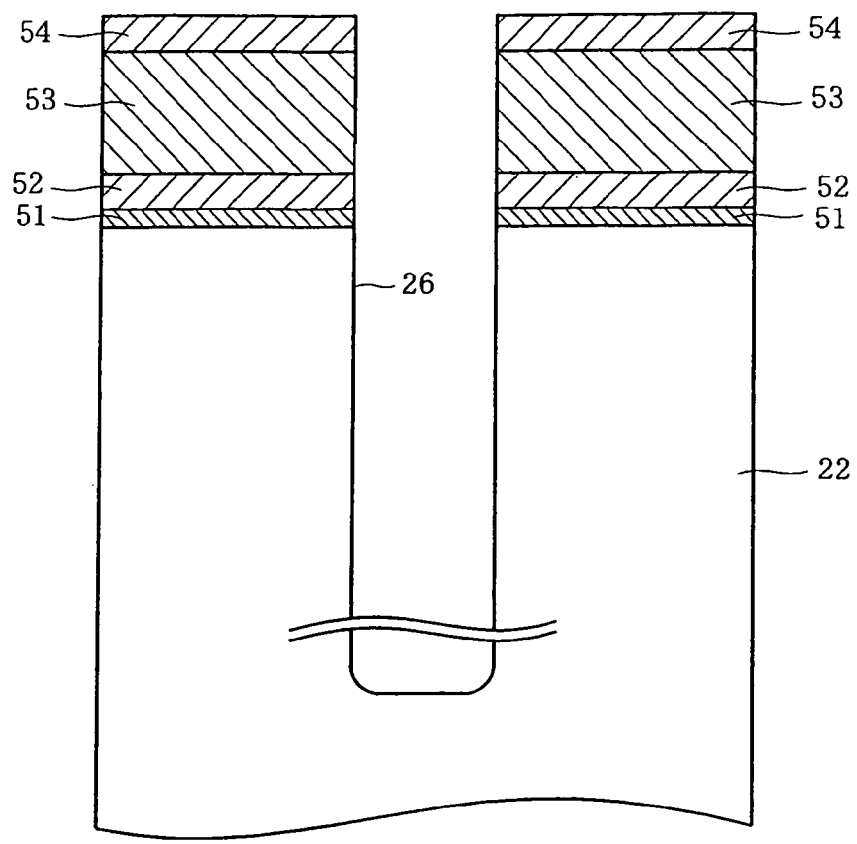

Subsequently, a photoresist (not shown) is patterned in order that a deep trench is formed in the TEOS film 54 as shown in FIG. 4. Anisotropic etching is carried out for the silicon oxide film 51, silicon nitride film 52, BSG film 53 and TEOS film 54. The resist pattern is then removed and subsequently, the substrate 22 is etched by anisotropic etching with the BSG and TEOS films 53 and 54 serving as a mask so that a predetermined depth is reached, as shown in FIG. 5. Subsequently, the BSG and TEOS films 53 and 54 are removed.

Figure 6:
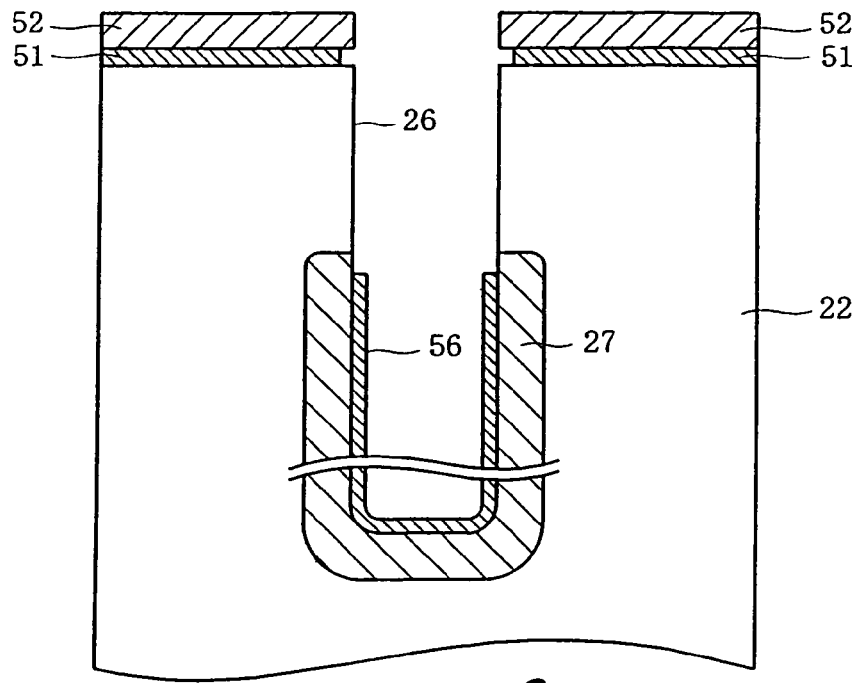
Figure 7:
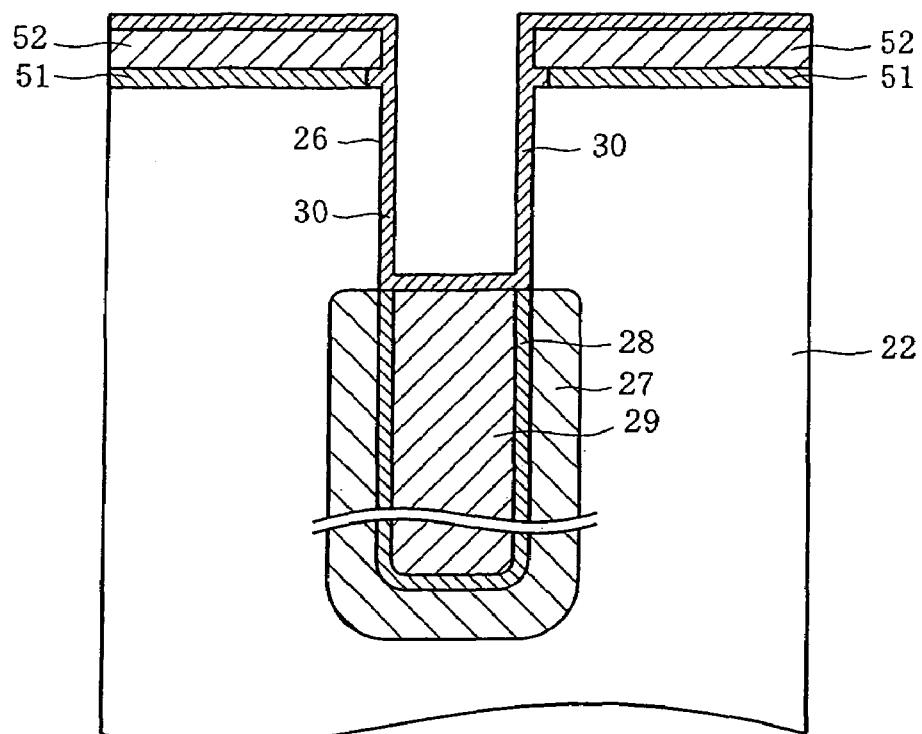

Furthermore, silica glass 56 is deposited on the inner surface of the trench 26 so as to extend from the bottom of the trench to a predetermined depth as shown in FIG. 6. The silica glass 56 is covered by the TEOS film (not shown) and then heat-treated at high temperatures so that a plate diffusion region 27 of the capacitor C is formed on the outer peripheral surface of the trench 26. The TEOS film and silica glass 56 both in the trench 26 are removed and the remainder is washed. Thereafter, part of the substrate 22 forming the inner surface of trench 26 is nitrided thinly such that the silicon nitride film is formed as shown in FIG. 7. The surface of the silicon nitride film is oxidized to be formed into the NO film 28.

The first conductive layer 29 made from a polycrystalline silicon doped with As is formed on the inside of the NO film 28. The first conductive layer 29 and the plate diffusion region 27 serve as both plate electrodes. Subsequently, the first conductive layer 29 and the NO film 28 are etched down to the top surface of the plate diffusion region 27. The insulating film 30 is then formed on the top surface of the plate diffusion region 27 isotropically relative to the inner surface of the trench 26. The insulating film 30 is formed by depositing the TEOS material.

Figure 8:
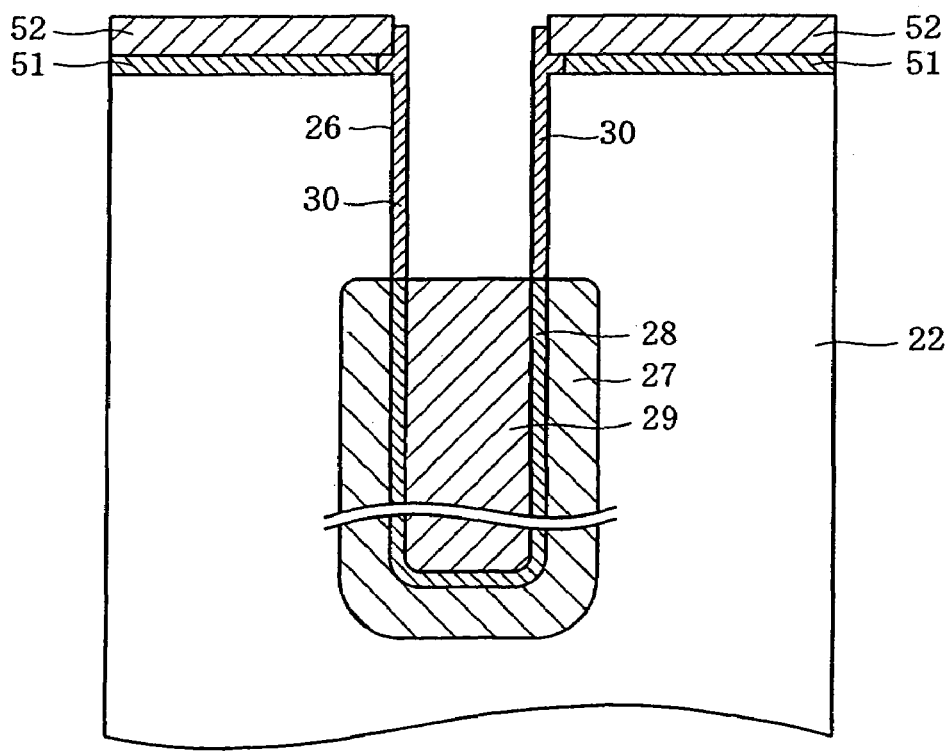

The insulating film 30 formed on the first conductive layer 29 is removed by anisotropic etching as shown in FIG. 8. Accordingly, the insulating film 30 remains on the inner wall surface of the trench 26. The remaining film is formed into the sidewall insulating film 30.

Figure 9:
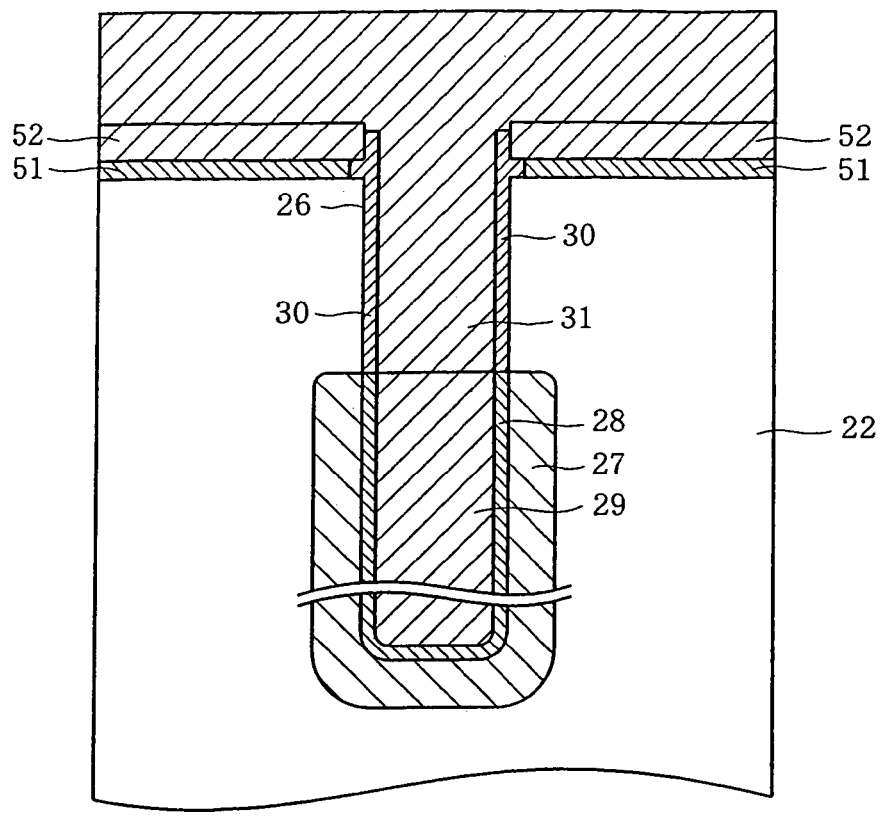
Figure 10:
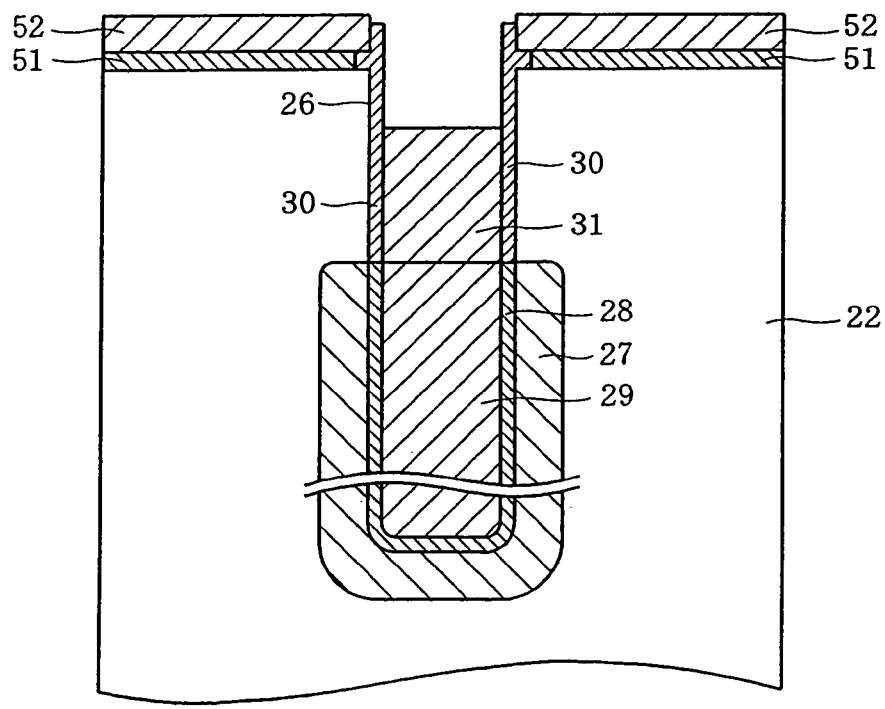

A second conductive layer 31 is formed on the first conductive layer 29 from which the insulating film 30 has been removed, as shown in FIG. 9. The second conductive layer 31 is made from a polycrystalline silicon doped with impurity, for example. The first and second conductive layers 29 and 31 may be made from amorphous silicon doped with impurity or polycide, instead. Subsequently, the second conductive layer 31 is etched down to a position located slightly deeper than the upper surface of the substrate 22, as shown in FIG. 10.

Figure 11:
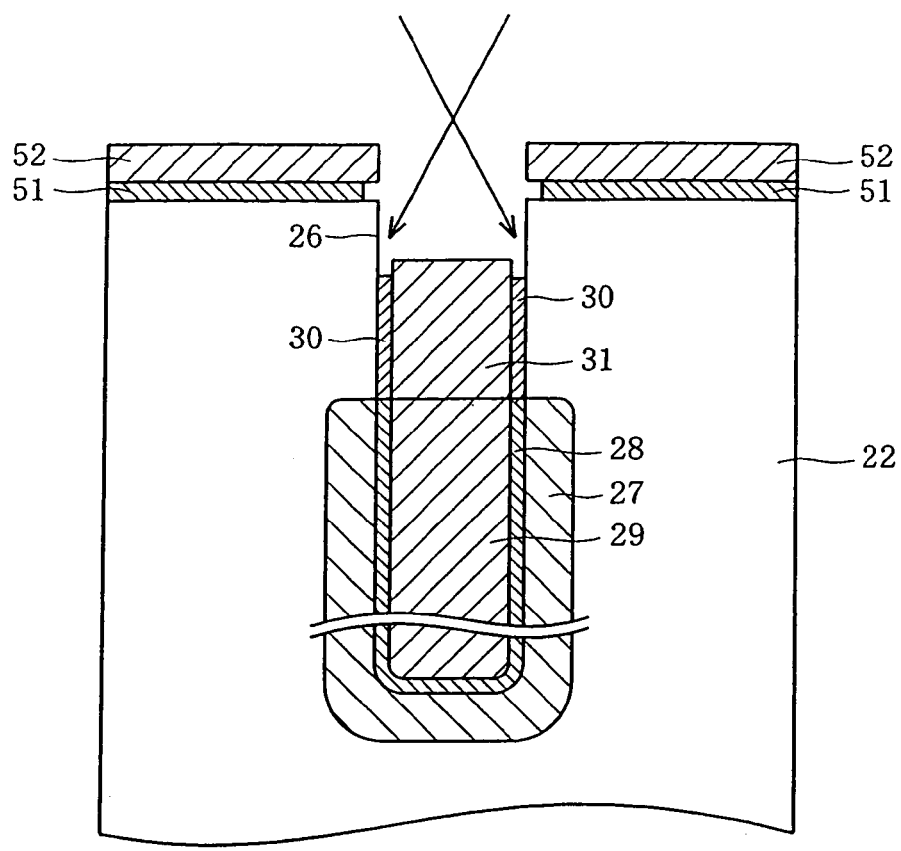

The insulating film 30 located at the upper exposed side formed with the second conductive layer 31 is selectively removed by isotropic etching as shown in FIG. 11. Acceptor-type impurity is implanted aslant from over the trench 26. In other words, ion is implanted from the central side of the trench 26 substantially in parallel to the flat face of the boundary 34 so that ion is prevented from being implanted to the boundary as shown in FIG. 1. In further other words, ion is implanted in the direction which is perpendicular to the channel of the cell transistor of the adjacent memory cell 24b and is slightly slant relative to the substrate 22. Acceptor-type impurity such as B+, BF$_2$+ or the like is desirable as a material for implanted ion.

Furthermore, no acceptor-type impurity is implanted to the strap 35 of the active area AAa formed at a predetermined side of the trench 26 in order that the function compensating impurity is supplied to the active area AAb of the memory cell 24b aslant relative to the upper surface of the substrate 22 as shown in FIG. 1. The reason for this is that the direction of supply or implantation becomes parallel to the strap 35. More specifically, since a region where the acceptor-type impurity is implanted (impurity implantation region) is adjusted mainly to the region (region 44b) under the gate of the adjacent memory cell region 24b (see a reverse conduction type impurity region 60 in FIGS. 1, 2A and 2B), no impurity is implanted to a PN junction region of the strap 35 in the adjacent memory cell region 24b. Consequently, the resistance value of the strap 35 can be suppressed. Furthermore, leak current from the junction can be prevented from being increased with increase in the density of acceptor impurity in the boundary 34a, and the charge retaining characteristic of the capacitor C can be prevented from being reduced with the increase in the aforesaid leak current.

Figure 12:
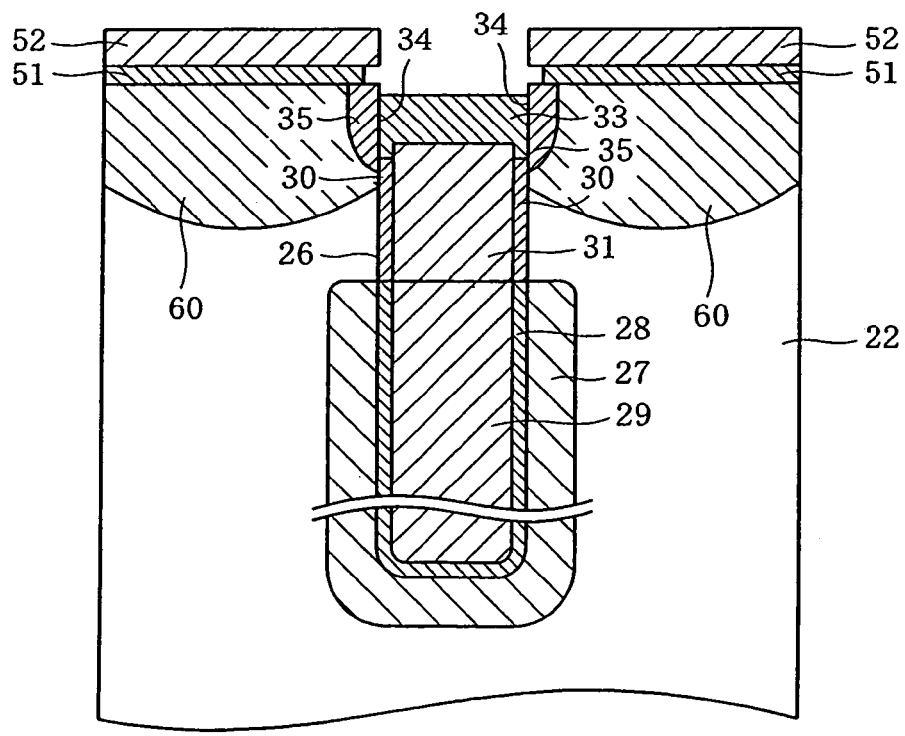

The third conductive layer 33 comprising the polycrystalline silicon doped with donor-type impurity is formed on the second conductive layer 31 and sidewall insulating film 30, as shown in FIG. 12. The third conductive layer 33 is etched back near to the top surface of the substrate 22. In this case, the impurity is diffused via the boundary 34 between the third conductive layer 33 and the substrate 22, whereby the strap 35 is formed.

The third conductive layer 33 is connected via the boundary 34 and strap 35 to the source/drain diffusion layer 38. The strap 35 may be formed by implanting donor-type impurity into the upper outer periphery of the trench 26 including the boundary 34, instead. The strap 35 serves to suppress the electrical resistance between the source/drain diffusion layer 38 of the cell transistor 23 and the capacitor C. In this case, when the trench 26 of the memory cell region is in proximity to the gate electrode of the adjacent active area AAb, the donor-type impurity diffused to the upper outer periphery of the trench 26 in the memory cell region reaches the p-type electrode region under the gate electrode 36 of the adjacent active area AAb and gate dielectric film 37. However, since the acceptor-type impurity has been supplied to the p-type electrode region under the gate electrode 36, the region under the gate can be prevented from being passivated. Consequently, the gate of the cell transistor 23 of the adjacent memory cell 24b can be prevented from being reduced, and reductions in the cutoff and punch-through characteristics can be suppressed.

Subsequently, the element isolating film 32 is formed on the side of the trench 26. The cell transistor 23 is formed so as to be electrically conductive to the source/drain diffusion layer 38 or the third conductive layer 33. The gate electrode 36 and gate dielectric film 37 are formed with the cell transistor 23. The interlayer dielectric film 42 and bit line 41 are then formed. Thus, the memory cell 24a provided with the cell transistors 23 and capacitors C can be configured, and the DRAM semiconductor storage 21 can be fabricated.

According to the foregoing fabrication method, the acceptor-type impurity is implanted to the p-type electrode region under the gate of the memory cell 24b from the trench 26 constituting the memory cell 24a aslant relative to the top surface of the substrate 22. Accordingly, reductions in the cutoff and punch-through characteristics of the cell transistors in the adjacent active area AAb can be suppressed even when the donor-type impurity such as phosphor or arsenic is supplied from the upper part of the trench 26 of the memory cell 24a to the upper periphery of the trench 26 including the boundary 34.

The acceptor-type impurity is selected as the impurity to be implanted. Consequently, the p-type electrode region under the gate electrode 36 and gate dielectric film 37 can be prevented from being passivated, and accordingly, the cutoff characteristic of the cell transistor 23 of the memory cell 24*b* can be improved.

Furthermore, the aforementioned effects can be achieved when a step of implanting the acceptor-type impurity is just added to the normal fabricating process.

A second embodiment of the invention will now be described. Since the second embodiment differs from the first embodiment in the fabricating process, only the difference in the fabricating process will be described.

In the first embodiment, the acceptor-type impurity is implanted to the active area AAb of the adjacent memory cell region 24*b* after the first and second conductive layers 29 and 31 and sidewall insulating film 30 have been formed. Subsequently, the third conductive layer 33 is formed in the trench 26, and the resistance-suppressing donor-type impurity is diffused to the upper periphery of the trench 26 so that the strap 35 is formed.

However, the second embodiment provides the following fabricating process, instead. After the forming of the first conductive layer 29, the insulating film 30 is formed on the sidewalls of the trench 26 over the first conductive layer 29 and the NO film 28. The second conductive layer 31 is formed inside the insulating film 30. A part of the insulating film 30 located at the upper exposed side formed with the second conductive layer 31 is removed thereby to be formed into the sidewall insulating film 30. The third conductive layer 33 is formed on the second conductive layer 31 and sidewall insulating film 30. The acceptor type impurity is implanted to the active area AAb of the adjacent memory cell 24*b* thereby to be formed into the reverse conduction type impurity region 60. In this case, when heat treatment is executed before or after the ion implantation, the electrical resistance suppressing donor-type impurity is diffused to the upper outer periphery of the trench 26 such that the strap 35 is formed. Since the subsequent fabrication steps are substantially the same as those in the first embodiment, the description of these steps will be eliminated. In this method, too, the function of the memory cell 24*b* is compensated.

According to the second embodiment, the reverse conduction type impurity region 60 is formed by the ion implantation from above the third conductive layer 33 after the forming of the third layer in the trench 26. Consequently, the second embodiment can achieve substantially the same effect as the first embodiment.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device including a plurality of active areas formed on a surface of a semiconductor substrate, each active area extending in a first direction and being adjacent to each other in a second direction perpendicular to the first direction, respectively, a plurality of trench capacitors disposed in ends of the active areas respectively, a plurality of gate electrodes disposed on the active areas and being adjacent to the trench capacitors of adjacent active areas in the second direction, respectively, the method comprising:

forming a plurality of trenches in the active areas respectively, the trenches having sidewalls and upper openings respectively;

forming a plurality of first conductive regions in the trenches so that the first conductive regions serve as electrodes of the trench capacitors respectively, each first conductive region including first impurity of a predetermined conductive type;

forming sidewall insulating films on the sidewalls located over the first conductive regions respectively;

forming a plurality of second conductive regions inside the sidewall insulating films respectively;

removing the sidewall insulating film located the second conductive regions respectively;

doping regions of the substrate located under the gate electrodes with second impurity of a reverse conduction type relative to the first impurity in the second direction from the upper openings through portions of the trenches form which the sidewall insulating films have been removed respectively; and forming a plurality of third conductive regions in said portions of the trenches.

2. A method of fabricating a semiconductor device including a first and a second active areas which are formed on a surface of a semiconductor substrate so as to extend in a first direction and are adjacent to each other in a second direction perpendicular to the first direction, each active area extending in a first direction and being adjacent to each other in a second direction perpendicular to the first direction, respectively, a first trench capacitor disposed in an end of the first active area, a second trench capacitor disposed in an end of the second active area, a first gate electrode disposed on the second active area and being adjacent to the second trench capacitor in the first direction and being adjacent to the first trench capacitor in the second direction, method comprising:

forming a first trench having a first opening and a first upper sidewall in the end of the first active area and a second trench having a second opening and a second upper sidewall in the end of the second active; and doping regions of the substrate under the first gate electrodes with impurity in the second direction from the second opening of the second trench through the second upper sidewall and further doping regions of the substrate under the second gate electrodes with impurity in the second direction from the first opening of the first trench through the first upper sidewall.

3. The method according to claim 1, wherein in the doping step, ions are implanted so as to be incident aslant relative to the surface of the substrate.

4. The method according to claim 2, wherein in the doping step, ions are implanted so as to be incident aslant relative to the surface of the substrate.

5. The method according to claim 2 further comprising:

forming impurity of a reverse conductive type relative to the impurity of a reverse conductive type relative to the impurity doped under the gate electrode between the first trench capacitor and the first gate electrode and between the second trench capacitor and the second gate electrode.

6. The method according to claim 1, wherein the first impurity is of a donor type and the second impurity is of an acceptor type.

* * * * *